United States Patent [19]
Godignon et al.

[11] Patent Number: 5,696,390
[45] Date of Patent: Dec. 9, 1997

[54] CURRENT LIMITER COMPONENT

[75] Inventors: Philippe Godignon, Barcelona, Spain; Jean-François De Palma, Vaulx en Velin; René Deshayes, Saint Priest, both of France; Juan Fernandez, Rubi; José Millan, Sabadell, both of Spain

[73] Assignees: Ferraz, Lyons, France; Centro Nacional de Microelectronica, Bellaterra, Spain

[21] Appl. No.: 688,156

[22] Filed: Jul. 29, 1996

[30] Foreign Application Priority Data

Jul. 28, 1995 [FR] France ................ 95 09442

[51] Int. Cl.⁶ .......................... H01L 29/74; H01L 31/111
[52] U.S. Cl. .......................... 257/109; 257/173; 257/174
[58] Field of Search ..................... 257/109, 173, 257/174

[56] References Cited

U.S. PATENT DOCUMENTS

| | | | |
|---|---|---|---|
| 2,959,504 | 11/1960 | Ross et al. | 257/109 |
| 3,078,196 | 2/1963 | Ross | 257/173 X |
| 3,093,755 | 6/1963 | Haberecht et al. | 257/109 X |
| 3,286,137 | 11/1966 | Luescher et al. | 257/109 |
| 5,483,086 | 1/1996 | Ohta | 257/109 X |

FOREIGN PATENT DOCUMENTS

| | | | |
|---|---|---|---|
| 1286370 | 11/1989 | Japan | 257/109 |
| 0978429 | 12/1964 | United Kingdom | 257/109 |

*Primary Examiner*—William Mintel
*Attorney, Agent, or Firm*—Dowell & Dowell

[57] ABSTRACT

A current limiter component constituted by a semiconductor bar or wafer doped in four layers (P, N, P, N) between its anode and cathode. The doping characteristics and the dimensional characteristics of the bar are adjusted to obtain a characteristic current to voltage curve which initially increases as voltage and current increases in the manner of a diode followed by a part constituting a current limiting plateau wherein the plateau reflects that the current remains fixed until the voltage reaches a breakdown voltage.

4 Claims, 1 Drawing Sheet

CURRENT LIMITER COMPONENT

BACKGROUND OF THE INVENTION

1. Field of the Invention

The present invention relates to a current limiter component, intended to be connected in series on a circuit branch for which a current limitation is desired.

2. History of the Related Art

In matters of current limiter components, or excess current limiters, Positive Coefficient or "PTC" Resistances are known, which are polymer components adapted to withstand high intensities. Their time of reaction to an excess current is, however, too slow to be able to use them for certain applications where the reaction of limitation must be very rapid.

Current limiter components of the MOS structure semiconductor type are known, which react rapidly but which cannot withstand high nominal intensities, for example of the order of some tens of Amperes as is often desired.

SUMMARY OF THE INVENTION

The invention, which aims at overcoming these drawbacks of known components, proposes an excess current limiter component which is adapted to withstand a nominal current of several tens of Amperes, and which reacts very rapidly to an accidental excess current, its reaction time being, for example, of the order of a microsecond.

Consequently, it relates to a current limiter component which is characterized in that it is constituted by a three-junction semiconductor wafer or bar, or "four-layer" component. The semiconductor is included between two electrodes, with one electrode, or anode, for input of the current to be limited and one electrode, or cathode, for output of this current, and successively comprising, between the anode and the cathode:

a first zone or layer, doped P;

a second zone or layer, doped N;

a third zone or layer, doped P;

and a fourth and last zone or layer, doped N.

The dimensional characteristics and doping characteristics of this semiconductor bar are chosen so that the current-voltage characteristic of this component is, on-line, that of a diode for all the intensity values of the current not exceeding a limiting value $I_L$. Further, for the limiting value $I_L$, this characteristic has a plateau, the current in that case remaining substantially constant and equal to the limiting value $I_L$ while the voltage at terminals of the component increases to a limiting voltage value $V_{BR}$ which corresponds to the breakdown voltage of the component.

The semiconductor bar or wafer, such as silicon, used for making this component, has a length (or "thickness") included between 160 and 700 microns and a base doping included between $10^{13}$ cm$^{-3}$ and $10^{15}$ cm$^{-3}$. The semiconductor has a first zone being doped P at more than $10^{18}$ atoms/cm$^{-3}$ with a relatively shallow diffusion, of depth typically included between 0.5 and 5 microns, and a fourth zone doped N at more than $10^{18}$ atoms/cm$^{-3}$ with a likewise relatively shallow diffusion, of depth typically included between 0.2 and 2 microns. The semiconductor also has second and third zones being respectively doped N at less than $10^{15}$ atoms/cm$^{-3}$, and P at a value included between $10^{17}$ and $10^{19}$ atoms/cm$^{-3}$, with a much deeper diffusion, of depth typically varying from 5 to 90 microns when the depths of the first and fourth zones vary respectively from 0.5 to 5 microns and 0.2 to 2 microns.

The respective doping characteristics of these four successive layers N,P,N,P is such that, for low levels of current, the sum of the current gains of the bipolar PNP transistor formed by the first three layers and of the bipolar NPN transistor formed by the last three layers, is equal to 1.

BRIEF DESCRIPTION OF THE DRAWINGS

The invention will be more readily understood, and its advantages and characteristics will better appear from the following description of an embodiment thereof; reference being made to the accompanying schematic drawing, in which.

DESCRIPTION OF THE PREFERRED EMBODIMENT

Figure 1:
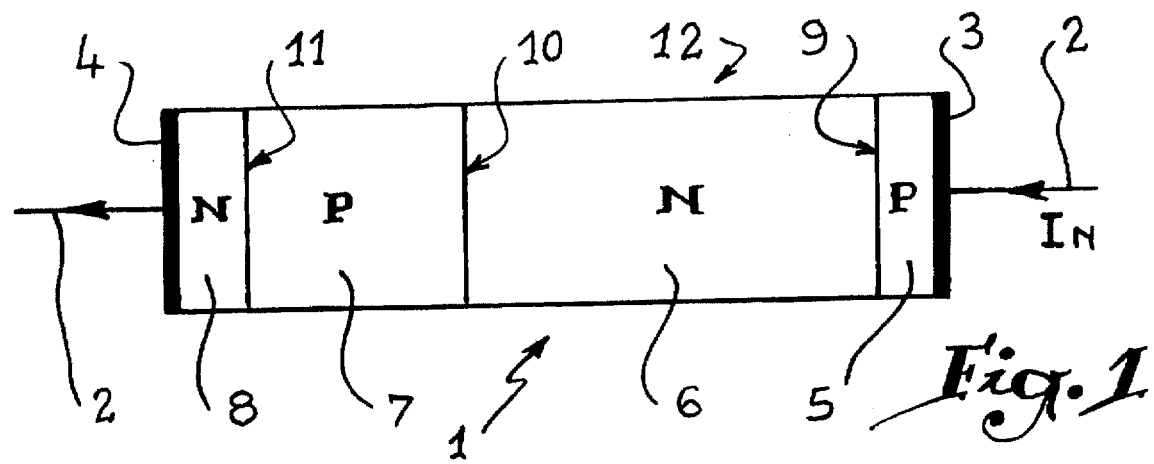
FIG. 1 schematically shows a semiconductor component, with its different layers as taught by the present invention.

Referring now to FIG. 1, the limiter component 1 of the invention is shown connected in series on an electric line 2 which has a unidirectional electric current passing therethrough, of which the nominal intensity $I_N$ is for example 50 Amperes.

This component 1 is provided with two electrodes, an anode 3 and a cathode 4, which conventionally make it possible to connect it in series on the electric line 2.

The component is constituted by a wafer or bar 12 of semiconductor material, typically silicon, which is doped as shown so as to define four successive zones or layers between anode 3 and cathode 4 wherein:

a first layer 5 is doped P;

a second layer 6 is doped N;

a third layer 7 is doped P;

a fourth layer 8 is doped N.

These four successive layers define three junctions 9, 10 and 11.

According to the invention, the dimensional characteristics and the doping characteristics of the silicon wafer 12 are chosen so that, contrary to another known component, the thyristor, which is also a four-layer component, the current-voltage characteristic of this component is, online, that of a diode for all the intensity values of the current not exceeding a limiting value $I_L$. Further, for this limiting value $I_L$, this characteristic has a plateau, the current remaining substantially constant and substantially equal to the limiting value $I_L$, while the voltage at the terminals of this component increases to a limiting voltage value $V_{BR}$ which corresponds to the breakdown voltage of the component.

Figure 2:
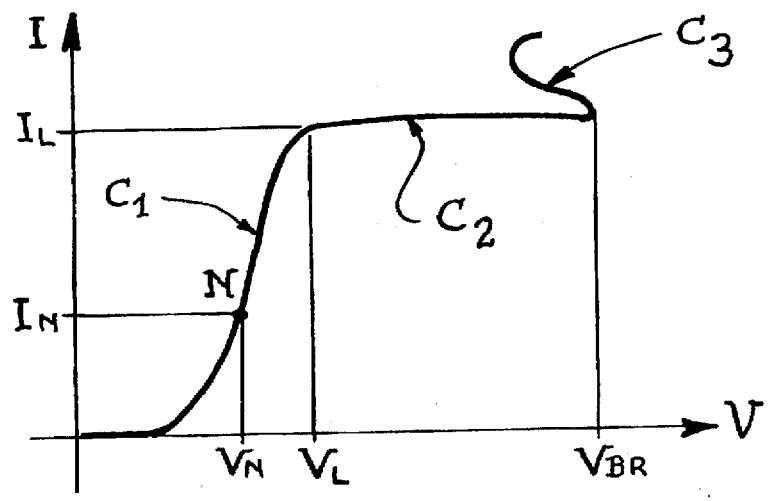
FIG. 2 is a current-voltage response characteristic.

The "current (I)—voltage (V)" characteristic which is finally obtained by choosing such dimensional and doping characteristics for the silicon wafer 12 is that shown in FIG. 2.

With the present invention, it is solely the question of the current/voltage characteristic on-line, as, contrary to the thyristor, the semiconductor component does not hold a reverse voltage and can therefore not function as a rectifier.

As may be seen in FIG. 2, as long as the current I which passes through component 1 remains less than a limiting value $I_L$, the characteristic I/V is that of a diode supplied on-line, or $C_1$, the voltage drop V at the terminals of the component therefore remaining very weak as is the case for a diode biased on line.

Nominal working point N has been marked on the curve, for which current I is the nominal current $I_N$, for example 5

Amperes, while the voltage drop $V_N$ at the terminals of the component 1 is less than 1 volt.

For a limiting value of current $I_L$ and voltage $V_L$, equal for example to 6 to 10 times the nominal current $I_N$, the curve I/V inflects sharply to become a plateau $C_2$ with substantially constant current and equal to $I_L$. Component 1 then functions as current limiter, while the voltage V at its terminals may then increase regularly.

Of course, this increase in voltage V is possible from voltage $V_L$ up to the limiter breakdown voltage $V_{BR}$ of the component 1, from which is produced the conventional phenomenon of avalanche (part $C_3$ of the curve) which leads to destruction of the component.

It should be noted that the plateau $C_2$ is due to a phenomenon of desaturation as discussed by certain authors. This phenomenon is, in the field of thyristors, a parasitic phenomenon and thyristors are therefore made so as to avoid it, contrary to the invention, where this phenomenon is advantageously exploited.

Figure 3:
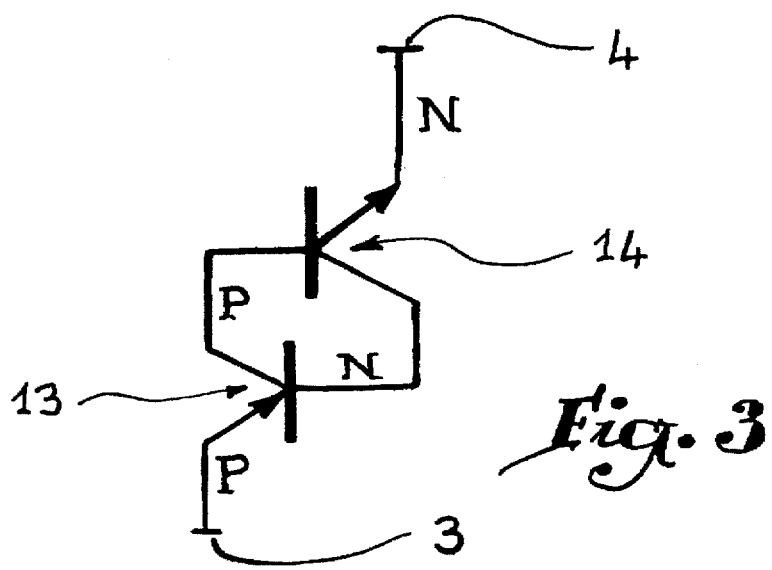
FIG. 3 is an equivalent circuit diagram.

An equivalent diagram of the component 1 is shown in FIG. 3, where layers 5, 6, 7 define a transistor 13 of PNP type while layers 6, 7, 8 define another transistor 14, of NPN type. This equivalent diagram is only approximative, since the component 1 does not hold the reverse voltage, which would not necessarily be the case of the circuit mounted in accordance with FIG. 3.

In order to obtain a limiter component 1 which functions in accordance with the characteristic of FIG. 2, it is necessary to adjust certain technological parameters, without which there would be a risk not only of obtaining a component which would not function like a current limiter, but also of obtaining a thyristor, i.e. a rectifier which would need to be triggered off by means of an auxiliary source in order to become conducting.

The breakdown voltage $V_{BR}$ depends essentially on the initial properties of the silicon bar 12, or substrate, before creation by doping of the three junctions 9, 10 and 11. Initial doping values of this substrate which are included between $10^{13}$ cm$^{-3}$ and $10^{15}$ cm$^{-3}$, and lengths (or "thicknesses") of the bar 12 included between 160 and 700 microns, have been found adequate for carrying out the invention.

The first zone 5 is doped P at more than $10^{18}$ atoms/cm$^{-3}$, with a relatively shallow diffusion, of depth typically included between 0.5 and 5 microns. The fourth zone 8 is doped N at more than $10^{18}$ atoms/cm$^{-3}$, with a likewise relatively shallow diffusion, of depth typically included between 0.2 and 2 microns. The second zone 6 is doped N to less than $10^{15}$ atoms/cm$^{-3}$, while the third zone is doped P at a value included between $10^{17}$ and $10^{19}$ atoms/cm$^{-3}$, both with a much deeper diffusion, of depth varying from 5 to 90 microns when the depths of the first and fourth zone 5, 8 vary, respectively, from 0.5 to 5 microns and from 0.2 to 2 microns.

By adjusting these characteristics in these ranges of values, it has been possible to obtain the characteristic of diode $C_1$, followed by the constant running or level plateau $C_2$.

It has been found that this result may be obtained, concerning the first and fourth zones 5, 8, or "emitters", either by using a process of doping by implantation+ diffusion, with implantation doses included between $7.10^{14}$ and $7.10^{15}$ cm$^{-2}$ and diffusion times included between 20 and 70 minutes in neutral or oxidizing environment, or by diffusion in solid, liquid or gaseous phase to obtain doping levels included between $5.10^{19}$ cm$^{-3}$ and $5.10^{20}$ cm$^{-3}$ for the fourth zone 8 doped N, and between $8.10^{18}$ cm$^{-3}$ and $8.10^{19}$ cm$^{-3}$ for the first zone 5, doped P, with depths of junctions ranging from 0.2 to 2 microns for the fourth zone 8 and from 0.5 to 5 microns for the first zone 5.

Similarly, the third zone 7, or "base", may be doped P either by a process of implantation +diffusion of impurities of type P, or by a process of diffusion in solid, liquid or gaseous phase.

The sum of the current gains of transistors 14 and 15 (FIG. 3) must be equal to 1 with low current.

The technology of manufacture of this current limiter 1 may either be "planar" technology or "mesa" technology.

In the foregoing, several ranges of doping values and depths are given. However, it should be noted that only certain combinations between values of the different ranges make it possible to obtain the desired characteristic. It may be considered that there are eight interdependent parameters. It therefore seems impossible to classify all the possibilities unless the entire ranges are considered and it is considered that, within these ranges, only certain combinations function.

In order to see how the optimalization of the component functions, let us take an example:

Let thickness substrate 12=320 microns and doping $10^{14}$ cm$^{-3}$ dose zone 7=8×$10^{14}$cm$^{-2}$ and annealing time 2000 hours at 1200° C.;

doping emitter 5=5×$10^{19}$ cm$^{-3}$ and depth 2 microns; and annealing time of the emitter 4=30 minutes.

These seven parameters (or groups of parameters) being set, a range for doping the emitter 4 (eighth parameter) can then be fixed: 9.2×$10^{19}$ to 1.2×$10^{20}$ cm$^{-3}$.

If one of the other seven parameters is changed, this range is no longer valid.

Moreover, there is a ninth parameter which will influence the characteristics: the life time of the carriers. This life time is not constant in the structure and it is possible that the component functions for one distribution of life time and that it does not function for another distribution (such distribution depending in particular on the conditions of manufacture).

We claim:

1. A current limiter comprising; a semiconductor bar including an anode for input of a current to be limited and a cathode for output of the current, said semiconductor bar successively including between said anode and cathode, a first layer doped P at greater than $10^{18}$ atoms/cm$^{-3}$ with a depth of diffusion between approximately 0.5 and 5 microns, a second layer doped N at less than $10^{15}$ atoms/cm$^{-3}$ and a diffusion depth of between approximately 5 to 90 microns, a third layer doped P at between $10^{17}$ and $10^{19}$ atoms/cm$^{-3}$ and a diffusion depth of between approximately 5 to 90 microns, and a fourth and last layer doped N at greater than $10^{18}$ atoms/cm$^{-3}$ and a diffusion depth of between approximately 0.2 to 2 microns, a first junction defined between said first and second layers, a second junction defined between said second and third layers and a third junction defined between said third and fourth layers, said first, second, third and fourth layers being doped and said semiconductor bar having dimensional characteristics such that a current-voltage graph characteristic of the current limiter is like that of a diode reflecting increase in both voltage values and current values for current values up to a current limiting value and, above the current limiting value, a graph characteristic of a plateau reflecting that the current value remains substantially constant until voltage increases to a breakdown voltage value.

2. The current limiter according to claim 1 wherein said semiconductor bar has a length between 160 and 700 microns and a base doping between $10^{13}$ cm$^{-3}$ and $10^{15}$ cm$^{-3}$.

3. The current limiter of claim 2 wherein said first, second and third layers define a first bipolar PNP transistor and said second, third and fourth layers define a bipolar NPN transistor, said first, second, third and fourth layers being doped in such a manner that at low levels of current a sum of current gains of said first and second bipolar transistors is equal to one.

4. The current limiter of claim 1 wherein said first, second and third layers define a first bipolar PNP transistor and said second, third and fourth layers define a bipolar NPN transistor, said first, second, third and fourth layers being doped in such a manner that at low levels of current a sum of current gains of said first and second bipolar transistors is equal to one.

\* \* \* \* \*